United States Patent
Kenney et al.

(10) Patent No.: US 7,652,471 B2
(45) Date of Patent: Jan. 26, 2010

(54) MAGNETIC TAGGING OF MAGNETORESISTIVE SENSORS

(75) Inventors: Christopher S. Kenney, Davis, IL (US); Nicholas F. Busch, Freeport, IL (US)

(73) Assignee: Honeywell International Inc., Morristown, NJ (US)

( * ) Notice: Subject to any disclaimer, the term of this patent is extended or adjusted under 35 U.S.C. 154(b) by 154 days.

(21) Appl. No.: 11/645,909

(22) Filed: Dec. 27, 2006

(65) Prior Publication Data

US 2008/0157758 A1    Jul. 3, 2008

(51) Int. Cl.
*G01B 7/30* (2006.01)
(52) U.S. Cl. .............................. 324/207.21; 324/207.25
(58) Field of Classification Search .. 324/207.2–207.25
See application file for complete search history.

(56) References Cited

U.S. PATENT DOCUMENTS

| | | | |
|---|---|---|---|
| 5,659,279 A | 8/1997 | Janssen et al. | |
| 5,777,952 A | 7/1998 | Nishimura et al. | |
| 6,260,261 B1 | 7/2001 | Marks et al. | |
| 6,480,394 B1 | 11/2002 | Feld et al. | |
| 7,425,824 B2 * | 9/2008 | Busch | 324/207.25 |
| 2007/0273365 A1 | 11/2007 | Lanter et al. | |

* cited by examiner

*Primary Examiner*—Jay M Patidar

(57) ABSTRACT

A magnet's N and S polarity can be alternately assembled within a MR sensor housing to determine the type of sensor that is assembled. In an MR sensor package including a housing having a sensing face and adapted for containing a sensing transducer and magnet, it can be determined if the MR sensor package is to be an X-type or Y-type sensor by testing the MR sensor package prior to labeling, shipping and/or use to determine its type by measuring the magnetic field emanating from the sensing face using a magnetic gauss probe. During assembly, the magnets N or S polarity is positioned to face the sensing face of the sensor to indicate the sensor type.

19 Claims, 3 Drawing Sheets

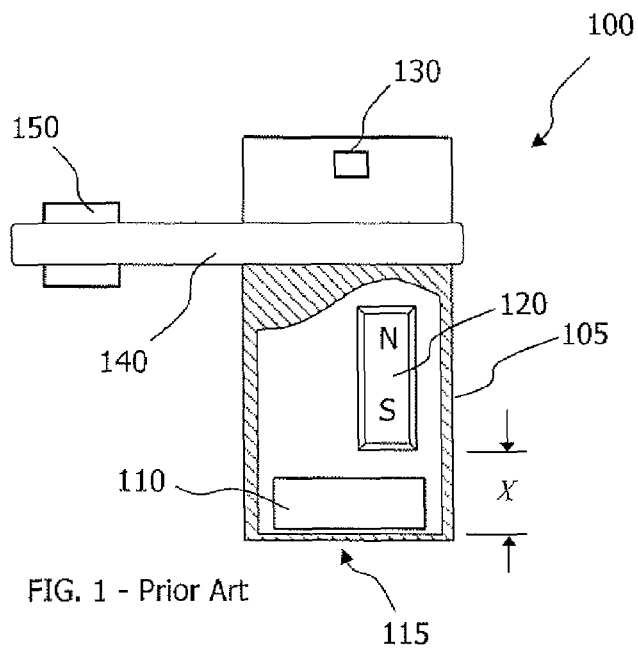
FIG. 1 - Prior Art
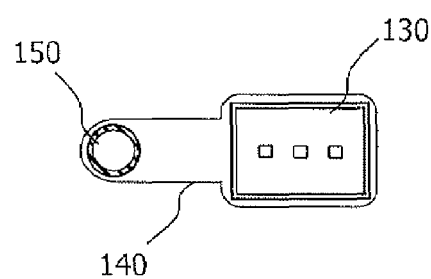
FIG. 3 - Prior Art
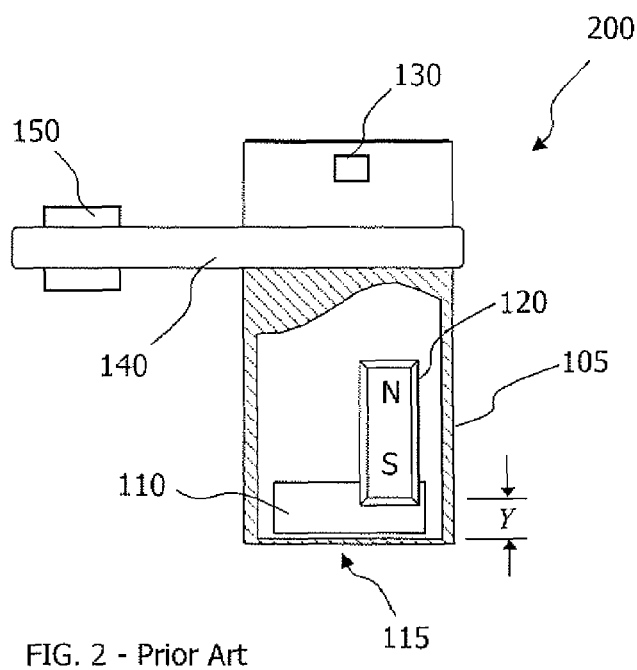
FIG. 2 - Prior Art

MAGNETIC TAGGING OF MAGNETORESISTIVE SENSORS

TECHNICAL FIELD OF THE INVENTION

The present invention is generally related to the field of sensors. More particularly, the present invention is related to the field of magnetic error proofing of sensor systems and components, such as magnetoresistive (MR) sensors.

BACKGROUND

Sensor systems such as magnetoresistive (MR) sensor modules provide a simple and cost effective solution for providing rotational speed measurement in both automotive and industrial applications. They typically consist of a magnetoresistive sensor element, a permanent magnet fixed to it and an integrated signal conditioning circuit. Relevant aspects such as mounting, electrical properties and possible encapsulation are important considerations for their use.

Angular and linear position sensors are widely used in automatic control systems as feedback-sensing devices in one or more control loops of the system. Various types of angular position sensors are currently used in the automobile industry in conjunction with vehicle steering wheels, or hand wheels, including relative, absolute, analog and digital angular position sensors. Known technologies that can be used to determine angular position include contact measurement, such as a resistance stripe, or non-contact measurement effects, based on inductance, capacitance, optical, or magnetic field. A relative angular position sensor measures the angular position of a rotating object by either incrementing or decrementing a counter, depending upon the rotational direction of the object, and relating that information to an angular reference point. Rotary position sensing is used in a number of applications, such as motor position feedback control and/or commutation, cam and crank shaft position sensing for controlling ignition timing, misfire detection, engine speed monitoring etc, robotics, and machine tool position control. Rotary position sensors utilize a magnetic field and a magnetosensitive device, such as a Hall effect device or a magnetoresistor located within the magnetic field. Absolute position sensors provide a sensed position signal which contains information about the absolute position relative to a predetermined position. An absolute position sensor indicates very precisely the position of the moving components, so that they can be controlled and, above all, so that these components can be relocated when the system in which they are integrated is activated. An absolute position sensor delivers a number of output signals in the case of a parallel digital output signal, but in the case of a series digital output signal, the sensor delivers a single signal resulting from a shaping according to a data transmission protocol and executed from the signals in parallel described in therein.

A 2-wire digital current output sensor for automotive manufacturers, the IX MR magnetoresistive wheel-speed sensor from Honeywell Sensing and Control, Freeport, Ill., can sense multiple ring magnets found in smart bearings, offering a one pulse per pair output. The system interfaces with typical electronic control unit modules for antilock braking systems; its low-gauss operation works over large sensing distances.

Magnetoresistive (MR) speed sensors are ideal for sensing the speed of an input or output shaft of an automatic transmission. The sensor is typically mounted in association with a transmission control unit (TCU). Angular Position Sensors, such as ratiometric MR sensors, are ideal for sensing the angle position of transmission components in the shift linkage of a transmission and are also mounted in association with a transmission control unit (TCU).

Among position sensing technologies, magnetic sensing is known to have a unique combination of long life components and excellent resistance to contaminants. Magnetic sensors typically rely upon permanent magnets, typically ferrite-based, to detect the presence or absence of a magnetically permeable object within a certain predefined detection zone relative to the sensor. In combination with the permanent magnet, some sensors of this type utilize magnetoresistive components located at particular positions relative to the permanent magnet and other. Generally, a magnet is used to create a magnetic field which is measured by an IC (integrated circuit) containing a magnetically sensitive feature. The magnet is connected to the element to be measured. The changing magnetic field at the IC caused by the interaction of the magnet with forces being measured is converted into an output signal proportional to the movement.

Magnetoresistive sensors are a type of magnetic sensor that uses the magnetoresistive effect to detect a magnetic field. Ferromagnetic metals, such as the nickel-iron alloy commonly known as Permalloy, alter their resistivity in the presence of a magnetic field. When a current is passed through a thin ferromagnetic film in the presence of a magnetic field, the voltage will change. This change in voltage represents the strength or direction of the magnetic field. Some magnetic position sensors provide an indication of the displacement of the mechanical component by using a magnetic field sensing device which reports the intensity of a magnetic field from a magnet which is positioned on the mechanical component. The magnet is positioned and the magnetic field sensing device is located relative to the magnet in such a fashion as to cause the magnetic field to vary in the magnetic field sensing device as the magnet moves.

Magnetic position sensors are a non-contact type of sensor which are devices that generate change to an electronically interrogated physical parameter that is proportional to the movement of a structure, such as, for example, an actuator shaft operatively coupled to the sensor. This change is achieved without physical contact between the parameter and the interrogation device. Magnetic position sensors consist of a magnetic field sensing device which is usually stationary and a magnet that is attached to a moving component. As the magnet approaches the sensing device the magnetic field of the magnet is detected and the sensing device generates an electrical signal that is then used for counting, display, recording and/or control purposes. In magnetic position sensing, the magnitude of magnetic field strength is generally measured by an appropriate measuring device, such as a magneto-resistive element. The value of the measured field intensity is translated through the measuring device to a voltage or current value that is uniquely representative of the specific rotational position of the actuator shaft.

One of the benefits of using magnetic sensors is that the output of the sensor is generated without the use of contacts. This is a benefit because over time contacts can degrade and cause system failures. Because such a position sensor bases positional detection on magnetic properties, this type of sensor inherently excels in resistance to exposure to common environmental contaminants such as water, oil, etc.

Referring to FIG. 1, a magnetoresistive (MR) sensor 100 is composed of a transducer 110 and a magnet 120 mounted within a housing 105. The housing 105 has a sensing face 115 where measurements are directly received by the sensor 100. An electrical connector 130 is also typically disposed on the housing 105 opposite the sensing face 115. A flange 140 is snuggly located around the outer surface of the housing 105 between the electrical connector 130 and sensing face 115. The flange 140 includes integrated mounting hardware 150, such as a brass bushing, which is used to fixably mount the MR sensor 100 to a system being monitored (not shown). A problem with MR sensors is encountered during manufacturing. A MR sensor may be manufactured for particular use specifications in mind. A MR sensor's magnet can be located at various distances relative to a sensing face, which causes the MR sensor to react differently for given applications. Referring again to the prior art MR sensor illustrated in FIG. 1, what is important to note is that the magnet 120 is mounted within the housing 105 at a fixed distance "X" from the sensing face 115 of the MR sensor 100. This distance dictates the type of sensing or sensing that will be accomplished by the MR sensor 100. Referring now to FIG. 2, a sensor similar in shape and hardware is as shown in FIG. 1 is shown. The MR sensor in FIG. 2, however, shows that the magnet is located at a new distance "Y" from the sensing face. The new distance determines that this sensor is used for a different application than the MR sensor in FIG. 1.

As described in the background as a common problem with sensors that are similar in size and look, but required for different uses, it is hard to determine the type of sensor that is embodied within the similar looking housing after manufacturing is accomplished. A need to overcome this limitation is required.

The present inventors present a system that can overcome limitations found in the art. The present inventors teach that two sensors can be built with the same form and fit (physically are the same shape), but require different magnetic calibration for an application target wheel. Normally under this scenario, the parts are kept segregated so they don't end up being used in the wrong application.

SUMMARY OF THE INVENTION

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

When building a movement or speed sensor, the direction of the magnetic field (North or South) has not been a consideration; however, implementing the unique aspects of the present invention, if a similar sensor package can be assembled for two different sensor applications with each requiring a unique calibration, then each sensor application can utilize a specific magnetic polarity that is the opposite of the other application. Upon assembly confirmation (processing sensors before they ship to the customer) or upon final testing before use, a gauss probe can measure the magnetic field for each sensor and verify that all the sensors being tested and shipped have the correct magnetic polarity.

A sensor, such as a magnetoresistive (MR) sensor, can be provided in accordance with features of the present invention that includes a housing having an outer surface and adapted for receiving and mounting a transducer and a magnet, said housing including a sensing face where measurements are directly received by the sensor; an electrical connector disposed on the housing opposite the sensing face; a transducer mounted in the housing and connected along with signal conditioning electronics to the connector; and a magnet selectively locatable at least two distances and polarities within the housing relative to the sensing face, including "X" distance with N polarity and "Y" distance with S polarity, wherein distance and polarity from the sensing face dictates what the type of sensor is contained within the housing.

Assembly considerations are now possible where an MR sensor can be manufactured with two different calibrations (for two unique products). Product "A" can be produced with the magnetic North pole of the magnet towards the sensor face. Product "B" would be produced with the magnetic South Pole of the magnet towards the sensor face. The difference in orientation of the magnets for each product can easily be accomplished during the calibration process using a magnet reader such as a Gauss probe that verifies magnetic polarity of the magnet supply and a rotary axis on the calibration head that would orient that magnet in either North or South orientation for the part being built. Two unique parts can therefore be built into final product using the same tooling, thus creating two sensors with the same form and fit, but slightly different functions. Escapement of sending the wrong part for the wrong application is provided by detecting the direction of the magnetic field at the final testing process.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

FIG. 1 illustrates a "prior art" MR sensor including a housing containing a transducer and permanent magnet mounted together near a sensing face, an electrical connector and mounting hardware, the MR sensor adapted for X-type applications.

FIG. 2 illustrates a "prior art" MR sensor including a housing containing a transducer and permanent magnet mounted together near a sensing face, an electrical connector and mounting hardware, the MR sensor adapted for Y-type applications.

FIG. 3 illustrates a top view of the "prior art" MR sensor of FIGS. 1 and 2, the view revealing the inside of the electrical connector and also illustrating a flange connecting the electrical connector and a hollow mounting bushing integrated into a flange.

DETAILED DESCRIPTION OF THE EMBODIMENTS

The particular values and configurations discussed in these non-limiting examples can be varied and are cited merely to illustrate at least one embodiment and are not intended to limit the scope thereof. Reference will be made to magnetoresistive (MR) sensors in the description, but is should be appreciated that other sensor can benefit from the teaching herein and it is the intent that the claims extend to motion sensors in general where common packaging can pose a post assembly identification problem.

Figure 4:
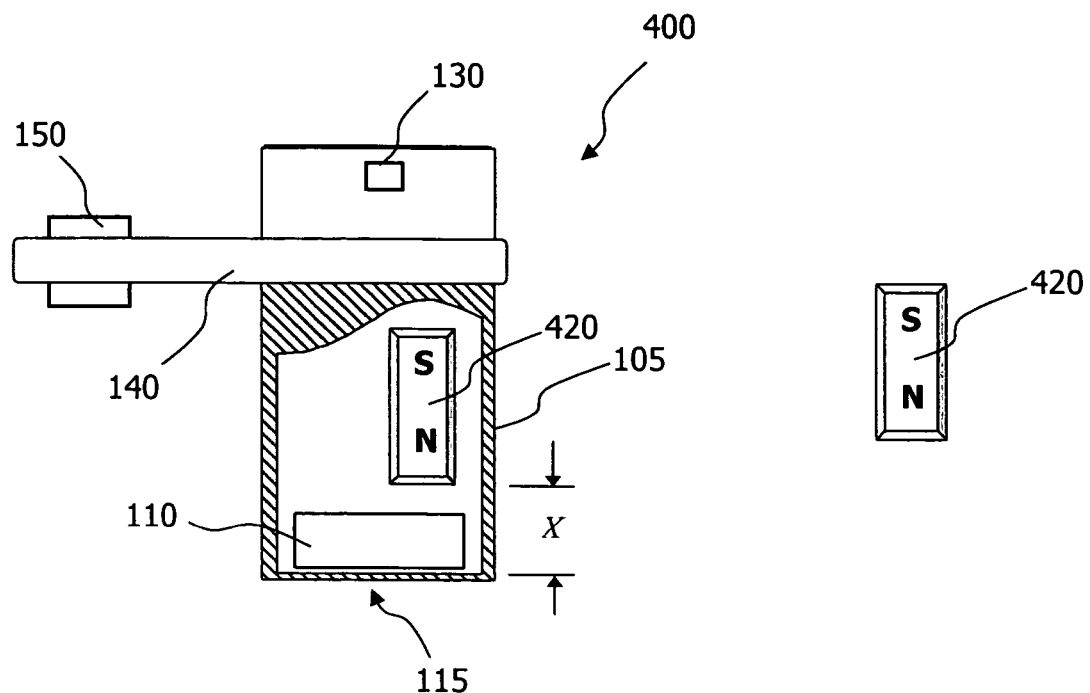
FIG. 4 illustrates a sensor in accordance with features of the present invention including a housing containing a transducer and permanent magnet mounted together near a sensing face, an electrical connector and mounting hardware, the sensor adapted for X-type applications, and the permanent magnet also oriented within the housing such that its N polarity is facing towards the sensing face.

Referring to FIG. 4, an improved magnetoresistive (MR) sensor 400 is composed of a housing 105 including a sensing face 115, a transducer 110 and a magnet 420 mountable within a housing 105 with either of its N or S polarity facing a sensing face 115. The sensing face 115 is where measurements are directly received by the sensor 100. An electrical connector 130 can also disposed on the housing 105 opposite the sensing face 115. A flange 140 can be snuggly located around the outer surface of the housing 105 between the electrical connector 130 and the sensing face 115. The flange 140 includes integrated mounting hardware 150, such as a brass bushing, which can be used to fixably mount the MR sensor 400 to a system being monitored (not shown).

The problem encountered with distinguishing the type of MR sensor contained in the housing following the manufacturing of MR sensors is preventable as will now be described. As discussed in the background, a MR sensor may be manufactured for particular use specifications in mind by varying the distance that magnet is located within the housing 105 relative to the sensing face 115. The magnet 420 can be located at various distances relative to a sensing face 115, which causes the MR sensor to react differently for given applications. The magnet 420 shown in FIG. 4 is mounted within the housing 105 at a fixed distance "X" from the sensing face 115 of the MR sensor 100. This distance shows that the type of sensor is an X-type, and the permanent magnet is oriented within the housing such that its N polarity is facing towards the sensing face which will reveal by external measurement that the sensor is an X-type sensor.

Figure 5:
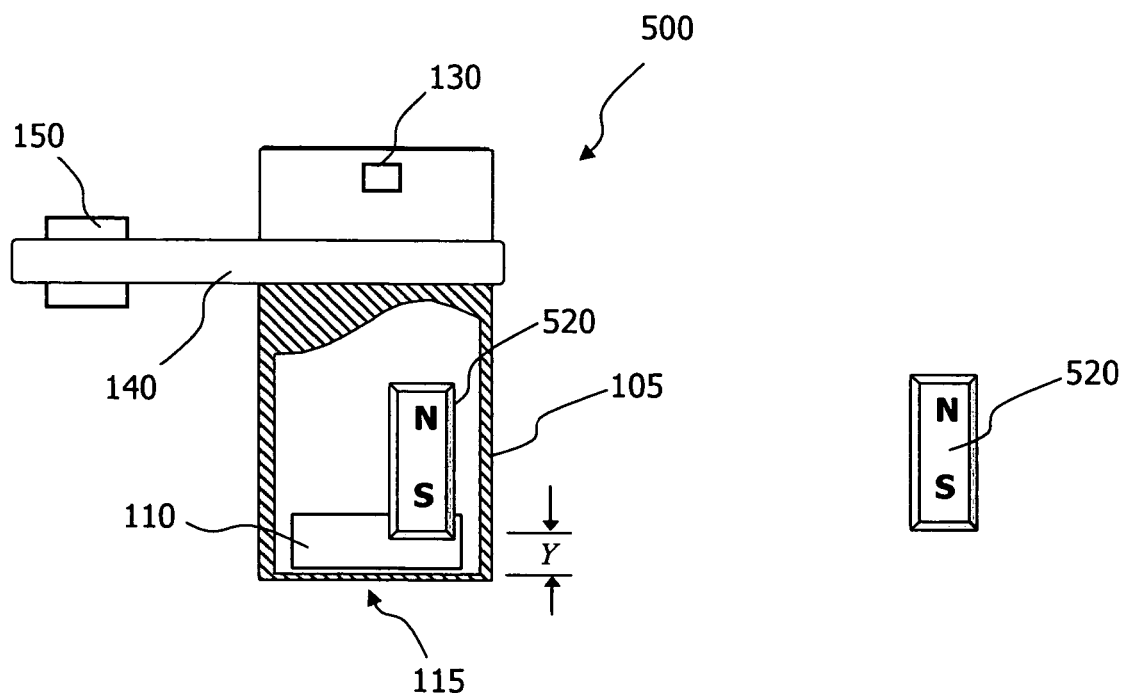
FIG. 5 illustrates a sensor in accordance with features of the present invention including a housing containing a transducer and permanent magnet mounted together near a sensing face, an electrical connector and mounting hardware, the sensor adapted for Y-type applications, and the permanent magnet also oriented within the housing such that its S polarity is facing towards the sensing face.

Now referring now to FIG. 5, a sensor similar in shape and hardware is as shown in FIG. 4 is shown. The MR sensor in FIG. 5, however, shows that the magnet 520 is located at a new distance "Y" from the sensing face, indicating the sensor to be a Y-type sensor; however, the magnet 520 in this case is shown to be oriented within the housing such that its S polarity is facing towards the sensing face. This change in polarity (from N to S) is the primary distinction available for determining the type of sensing contained in the housing 115.

The magnet 420/520 can take several forms. Without limiting the scope of the present invention, it is common to use a ferrite magnet within sensors. It can be appreciated that a ferrite magnet can be used in the present sensing system; although other magnet usage is acceptable for some applications.

It can now be appreciated that the sensor can be used for various applications including motor position feedback control and/or commutation, cam and crank shaft position sensing for controlling ignition timing, misfire detection, engine speed monitoring, antilock braking systems, robotics, and machine tool position control.

Figure 6:
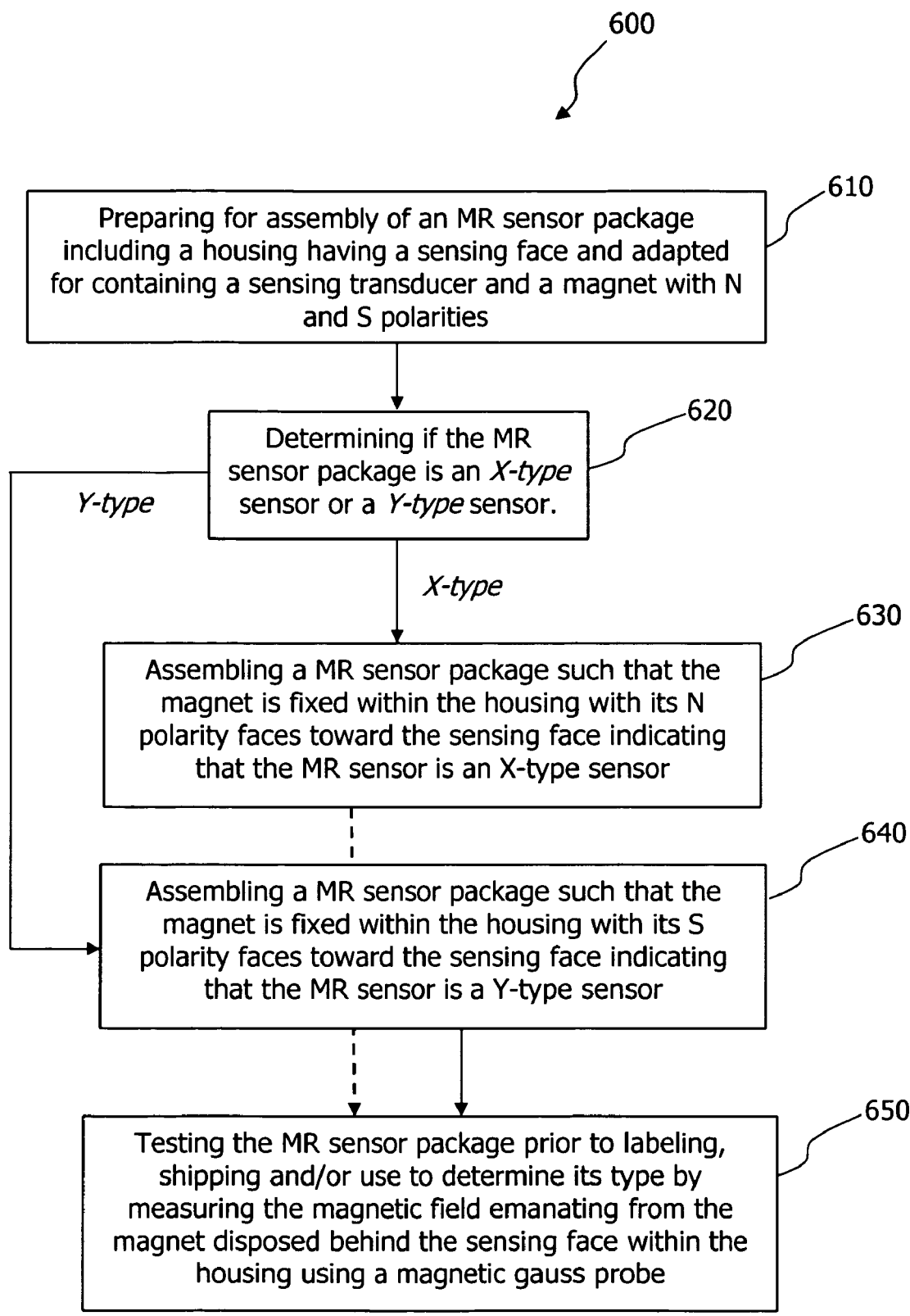
FIG. 6 illustrates a flow diagram in accordance with features of the present invention, the flow diagram depicting steps of assembling and testing a sensor with polarity labeling.

Referring to FIG. 6, a flow diagram 600 illustrates how a packaged sensor type can be manufactured so that its type can be determined. Referring to Block 610, assembly of an MR sensor package including a housing having a sensing face and adapted for containing a sensing transducer and a permanent magnet with N and S polarity is prepared for. It is determined if the MR sensor package is to be an X-type sensor or a Y-type sensor as shown in Block 620. If it is determined that the MR sensor package that will be assembled will be an X-type sensor, the MR sensor package is assembled such that the permanent magnet is fixed within the housing with its N polarity facing toward the sensing face indicating that the MR sensor is an X-type sensor as shown in Step 630. But if it is determined that the MR sensor package that will be assembled will be a Y-type sensor, the MR sensor package is assembled such that the permanent magnet is fixed within the housing with its S polarity facing toward the sensing face indicating that the MR sensor is an Y-type sensor such as shown in Step 640. Once an MR sensor has be assembled, it can be determined what type of sensor it is by testing the MR sensor package prior to labeling, shipping and/or use to determine its type by measuring the magnetic field emanating from the sensing face using a magnetic gauss probe as shown in Block 650.

The invention claimed is:

1. A sensor assembly comprising:
a housing having an outer surface and adapted for receiving and mounting a transducer and a magnet, said housing including a sensing face where measurements are directly received by the sensor;
an electrical connector disposed on the housing opposite the sensing face;
a transducer mounted in the housing along with signal conditioning electronics and connected to the connector; and
a magnet selectively positioned in one of two positions within the housing relative to the sensing face, including a first position an "X" distance away from to the sensing face with an N polarity of the magnet facing towards the sensing face, and a second position a "Y" distance away from the sensing face with an S polarity of the magnet facing toward the sensing face, the magnet is positioned in the first position to construct a first sensor type, and the magnet is positioned in the second position to construct a second sensor type.

2. The sensor assembly of claim 1 wherein said magnet comprises a permanent magnet.

3. The sensor assembly of claim 1 wherein said magnet comprises a ferrite magnet.

4. The sensor assembly of claim 1 further comprising a flange wrapped around the outer surface of the housing between the electrical connector and the sensing face.

5. The sensor assembly of claim 4 further comprising mounting hardware integrated into the flange next to the housing, said mounting hardware used to fixably mount the sensor to a monitored system.

6. The sensor assembly of claim 5 wherein said magnet comprises a ferrite magnet.

7. The sensor assembly of claim 1, said sensor adapted for use in at least one of: motor position feedback control, motor feedback commutation, cam shaft position sensing determination, crank shaft position determination, misfire detection, engine speed monitoring, antilock braking system control, machine tool position determination, machine tool position control.

8. A sensor assembly comprising:
a housing including a sensing face,
a transducer; and
a magnet having N and S polarities;
the magnet is positioned in one of two positions within the housing including a first position a first distance away from to the sensing face with the N polarity facing the sensing face, and a second position a second distance away from the sensing face with the S polarity facing the sensing face, the magnet is positioned in the first position when constructing a first sensor type, and the magnet is positioned in the second position when constructing a second sensor type.

9. The sensor assembly of claim 8 wherein said magnet comprises a permanent magnet.

10. The sensor assembly of claim 8 wherein said magnet comprises a ferrite magnet.

11. The sensor assembly of claim 8, further comprising an electrical connector secured relative to the housing.

12. The sensor assembly of claim 11, further comprising a flange snuggly located around an outer surface of the housing.

13. The sensor assembly of claim 12, wherein the flange includes mounting hardware configured to fixably mount the sensor assembly to a system being monitored.

14. The sensor assembly of claim 13, wherein the mounting hardware includes a brass bushing.

15. The sensor assembly of claim 11 wherein said magnet comprises a permanent magnet.

16. The sensor assembly of claim 11 wherein said magnet comprises a ferrite magnet.

17. A method of assembling a sensor including a housing having a sensing face and adapted for containing a sensing transducer and a magnet with N and S polarity, wherein said method of assembling is executed for providing ease in determining the type of sensor contained in the housing after sensor assembly, the method comprising the steps of:
  determining if the sensor package is to be an X-type sensor or a Y-type sensor; and
  if it is determined that the sensor package is to be an X-type sensor, the sensor package is assembled such that the magnet is fixed within the housing with its N polarity facing toward the sensing face indicating that the sensor is an X-type sensor;
  if it is determined that the sensor package is to be a Y-type sensor, the sensor package is assembled such that the magnet is fixed within the housing with its S polarity facing toward the sensing face indicating that the sensor is an Y-type sensor.

18. The method of claim 17 further including the step of determining the type of sensor by sensing which polarity is facing toward the sensing face using a magnetic gauss probe.

19. The method of claim 18 wherein the magnet is a ferrite magnet.

* * * * *